United States Patent [19]

Gibbs et al.

[11] Patent Number: 5,347,386
[45] Date of Patent: Sep. 13, 1994

[54] CONTROL APPARATUS

[75] Inventors: Terence K. Gibbs, Portsmouth; Graham Luck, Chichester, both of England; David Wares, Glasgow, Scotland

[73] Assignee: International Business Machines Corporation, Armonk, N.Y.

[21] Appl. No.: 778,036

[22] Filed: Oct. 17, 1991

[30] Foreign Application Priority Data

Oct. 17, 1990 [EP]  European Pat. Off. ......... 90311404.9

[51] Int. Cl.⁵ ............................................. H04B 10/00
[52] U.S. Cl. ..................................... 359/146; 359/147; 359/169; 250/221
[58] Field of Search ............... 359/146, 147, 169, 170; 250/221

[56] References Cited

U.S. PATENT DOCUMENTS

| 4,305,006 | 12/1981 | Walthall et al. | 307/38 |
| 4,527,197 | 7/1985 | Nolte | 358/168 |
| 4,650,986 | 3/1987 | Maile | 250/221 |
| 4,727,593 | 2/1988 | Goldstein | 359/147 |
| 4,964,693 | 10/1990 | Branan | 359/146 |
| 5,281,808 | 1/1994 | Kunkel | 220/221 |

FOREIGN PATENT DOCUMENTS

| 0145966 | 6/1985 | European Pat. Off. . | |
| 0324606 | 7/1989 | European Pat. Off. . | |
| 2517030 | 10/1976 | Fed. Rep. of Germany . | |
| 0083337 | 7/1978 | Japan | 359/146 |
| 0132233 | 5/1989 | Japan | 359/147 |

OTHER PUBLICATIONS

Sheiner, "Direct Conversion of Sound Waves to Light Waves Using Interferometric Techniques", IBM Tech. Disclosure, vol. 22, #1, Jun. 1979.

Primary Examiner—Leslie Pascal
Attorney, Agent, or Firm—David Aker

[57] ABSTRACT

Solid state optoelectronic control apparatus responsive to manual stimulus is presented. The control apparatus comprises: a transmitter (20) having a light source (38) for projecting a beam of light along a path normally directed away from a photo sensitive detector (24); characterised in that the control apparatus further comprises: a receiver (21) for generating an enable pulse having a duration determined by a length of time for which the beam is reflected towards the detector by a digit or similarly reflective article; and conversion means (31) for varying an output signal level (44) as a function of the duration of the enable pulse. The conversion means increases the signal level (44) in response to and during a first enable pulse, and decreases the signal level in response to and during a second enable pulse occurring next to the first enable pulse. In a preferred example of the present invention, the conversion means (31) further decreases the signal level during the first enable pulse when the signal level (44) reaches a maximum value, and increases the signal level (44) during the second enable pulse when the signal level (44) reaches a minimum value.

In a display device (10) having a display screen (12) mounted in a bezel (11) and further comprising control apparatus of the present invention, the light source (38), the detector (24) and a visible light emitting power on indicator (113) are directed towards an aperture (112) in the bezel (11) by a translucent light guide (100).

10 Claims, 7 Drawing Sheets

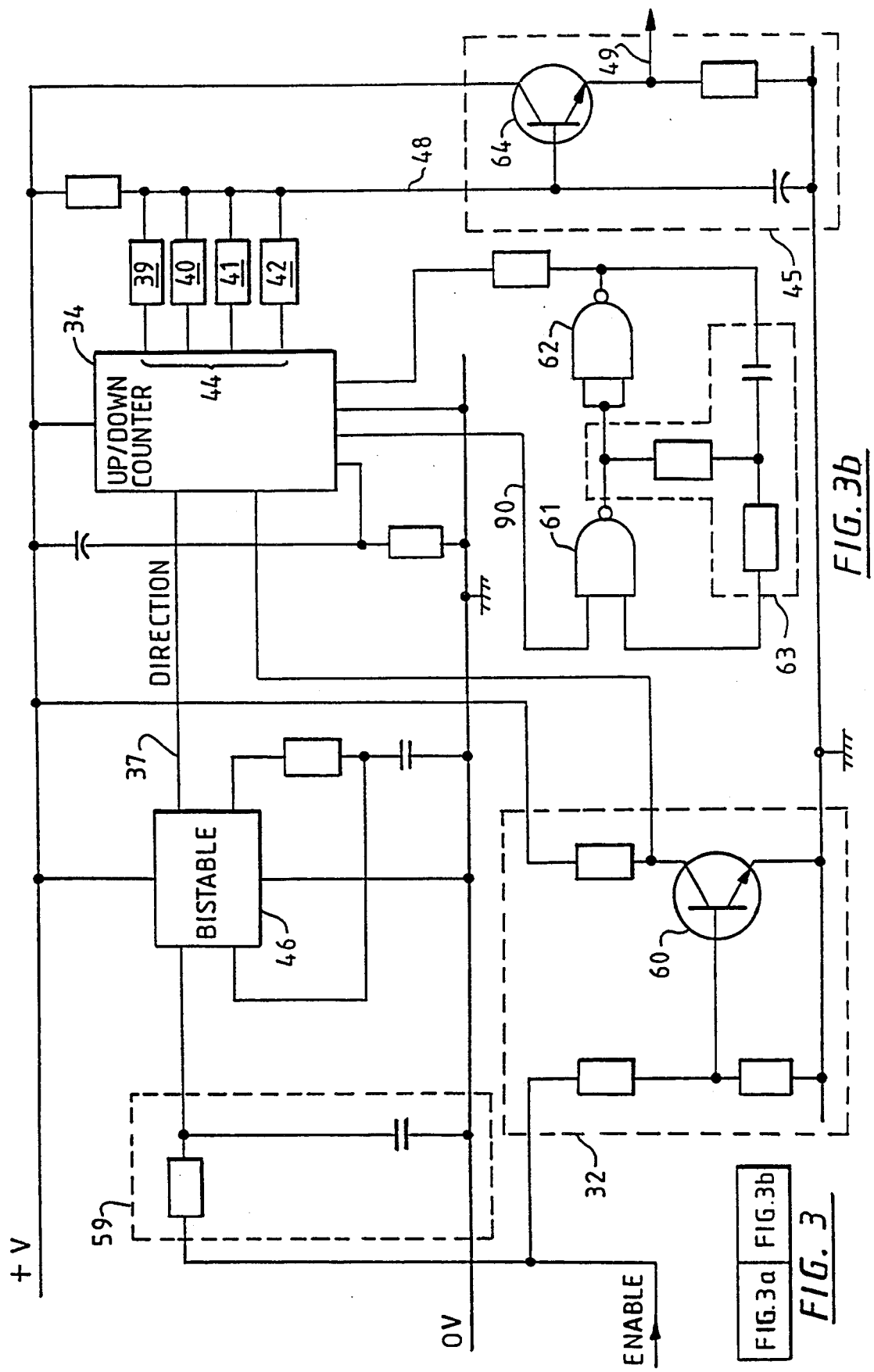

CONTROL APPARATUS

TECHNICAL FIELD

The present invention relates to control apparatus and in particular to solid state optoelectronic operating controls responsive to manual stimulus. Specifically, the present invention is directed to solid state controls for an electrical appliance such as a display device.

BACKGROUND ART

Display devices such as television receivers and computer visual display units normally have manually operated brightness and contrast controls. These controls allow the user to adjust the brightness and contrast of the displayed picture by a desired amount. Conventionally, each control has been implemented by a variable resistance potentiometer comprising a track of electrically resistive material. Each end of the track is connected to a separate electrical terminal. A third terminal or "wiper" is held in contact with the track by a spring bias. The wiper can be moved along the length of the track to vary the resistance between the wiper and one of the other two terminals. In a rotary action variable resistance potentiometer, the wiper is fixed to a rotatable spindle and held in contact with an annular track. A linear potentiometer has the wiper fixed to slideable support and held in contact with a linear track.

Variable resistance devices such as rotary action and linear potentiometers have a disadvantage in that friction between the wiper and the track causes wear and eventually failure of the device. Furthermore, some potentiometers are too large to be accommodated within desired equipment enclosures.

There is presently available a type of domestic television receiver (TVs) responsive to signals transmitted from a remote control device. The remote control device allows an operator to make a TV channel selection from a viewing position remote from the TV. In addition the remote control device enables the operator to select a desired TV picture brightness. The remote control device implements a selection by transmitting a digitally coded instruction to the TV set in the form of a beam of pulse modulated infra red radiation. Generally, the instruction consists of either a) a "start" signal instructing the TV set to start increasing or decreasing the TV picture brightness, or b) a "stop" signal instructing the TV set to stop increasing or decreasing the TV picture brightness, depending on the selection made by the operator. The operator is thus provided with the convenience of adjusting the brightness and contrast of the TV picture without moving from a viewing position distant from the TV. However, the remote control device operates under power supplied by a battery. The battery must therefore be regularly replaced or recharged to maintain the remote control device in an operational state. Furthermore, the remote control device comprises complex transmitter circuitry and the host TV comprises equally complex decoder circuitry. Although the cost of such complex circuitry can become acceptable where production quantities are high, in other applications the cost can be prohibitive.

SUMMARY OF THE INVENTION

An aim of the present invention is to provide control apparatus for overcoming the aforementioned problems.

In accordance with the present invention there is now provided control apparatus responsive to manual stimulus comprising: a transmitter having a light source for projecting a beam of light along a path normally directed away from a photo sensitive detector; characterised in that the control apparatus further comprises: a receiver for generating an enable pulse having a duration determined by a length of time for which the beam is reflected towards the detector by a digit or similarly reflective article; conversion means for varying an output signal level as a function of the duration of the enable pulse.

This has the advantage of providing increased reliability ever conventional mechanical potentiometers. Furthermore, controls of the present invention can be arranged to occupy less space than most conventional potentiometer controls. This provides increased freedom in design of equipment enclosures for housing the controls. Thus, control apparatus of the present invention is particularly suitable for replacing conventional potentiometer controls in densely packed equipment enclosures such as those housing visual display devices.

Preferably, the conversion means comprises first means for increasing the signal level in response to and during a first enable pulse, and for decreasing the signal level in response to and during a second enable pulse occurring next to the first enable pulse. In a preferred examples of the present invention, the conversion means further comprises second means for decreasing the signal level during the first enable pulse when the signal level reaches a maximum value, and for increasing the signal level during the second enable pulse when the signal level reaches a minimum value.

This has the advantage of providing solid state controls which are not operated through complex hand movements normally associated with the potentiometers of the prior art. Control apparatus of the present invention is therefore adapted for use by disabled operators.

In preferred examples of the present invention to be described later, the conversion means comprises a bidirectional counter having: a clock input responsive to a first clock signal when the enable pulse is asserted on an enable input; a direction input responsive to direction control means for configuring the counter to count up in response to the first enable pulse, and for configuring the counter to count down in response to the second enable pulse. The first means comprises a bistable circuit for switching the direction input between a first logic state and a second Ionic state in response to the leading edge transition of the enable pulse. The second means comprises an Exclusive Or (EOR) gate for triggering the bistable circuit to switch the direction input between first and second states in response to either a leading edge transition of the enable pulse or a leading edge transition on an overflow output from the counter. The conversion means comprises a digital to analog convertor having inputs connected to outputs of the counter for generating the output signal as a function of the outputs of the counter. The transmitter comprises an oscillator having an output connected to the light source for pulse-modulating the beam of light with a second clock signal. The second clock signal has a frequency at least twice as great as the frequency of the first clock signal. A comparator having inputs connected to the oscillator output and the detector output for generating the enable pulse wherein the enable pulse duration is determined by a period for which the pulses at the oscillator output are coincident with the pulses from detector output. The light source comprises an infra red light emitting diode (LED) and the detector comprises a phototransistor.

In particularly preferred examples of the present invention, the light source, the detector and a visible light emitting power-on indicator are directed towards an aperture in an equipment enclosure by a translucent light guide. However, it will be appreciated that, in other examples of the present invention, the visible light emitting power-on indicator may also serve as the light source thereby incurring considerable saving in component expense. Furthermore, the oscillator included in such examples of the present invention may operate at an oscillating frequency selected to provide a flashing power-on indicator.

BRIEF DESCRIPTION OF THE DRAWINGS

Preferred embodiments of the present invention will now be described by way of example, with reference to the accompanying drawings in which:

FIGS. 3, 3a and 3b are connected circuit diagrams of an example of control apparatus of the present invention.

DESCRIPTION OF THE PREFERRED EMBODIMENTS

Figure 1:
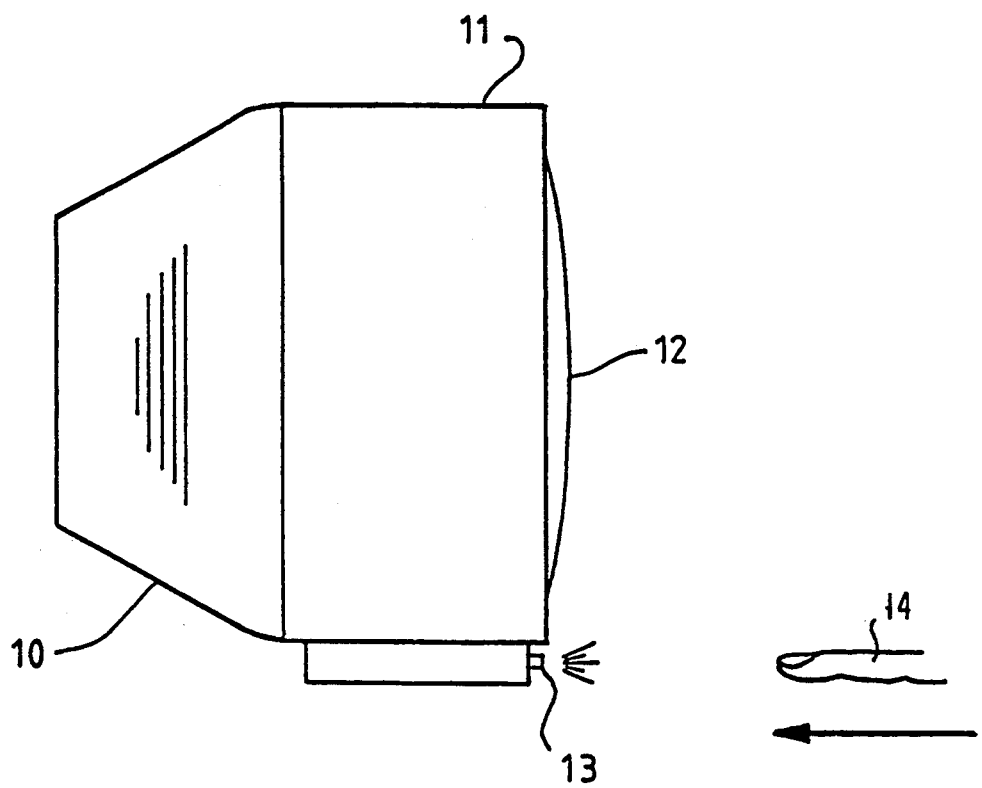
FIG. 1 is a side view of a display device comprising control apparatus of the present invention.

An example of a visual display device comprising control apparatus of the present invention will now be described with reference to FIG. 1. The display device 10 comprises a display screen 12 mounted in a bezel 11. In the bezel 11, there is provided a power indicator 13 which illuminates when the display device 10 is switched on. The indicator 13 comprises a visible light emitting diode (LED) (not shown) directed towards the operator through a light guide (not shown) manufactured from a translucent material. The control apparatus comprises an infra red LED (not shown) which is also directed through the light guide. In operation, the infra red LED generates a beam of infra red light pulses which is normally directed away from an adjacent phototransistor. However, when a suitably reflective article 14, such as a fingertip, is placed in the path of the beam, the pulses are reflected back through the light guide into the phototransistor (not shown). The phototransistor acts as a switch for translating the light pulses into electrical pulses.

Figure 2:
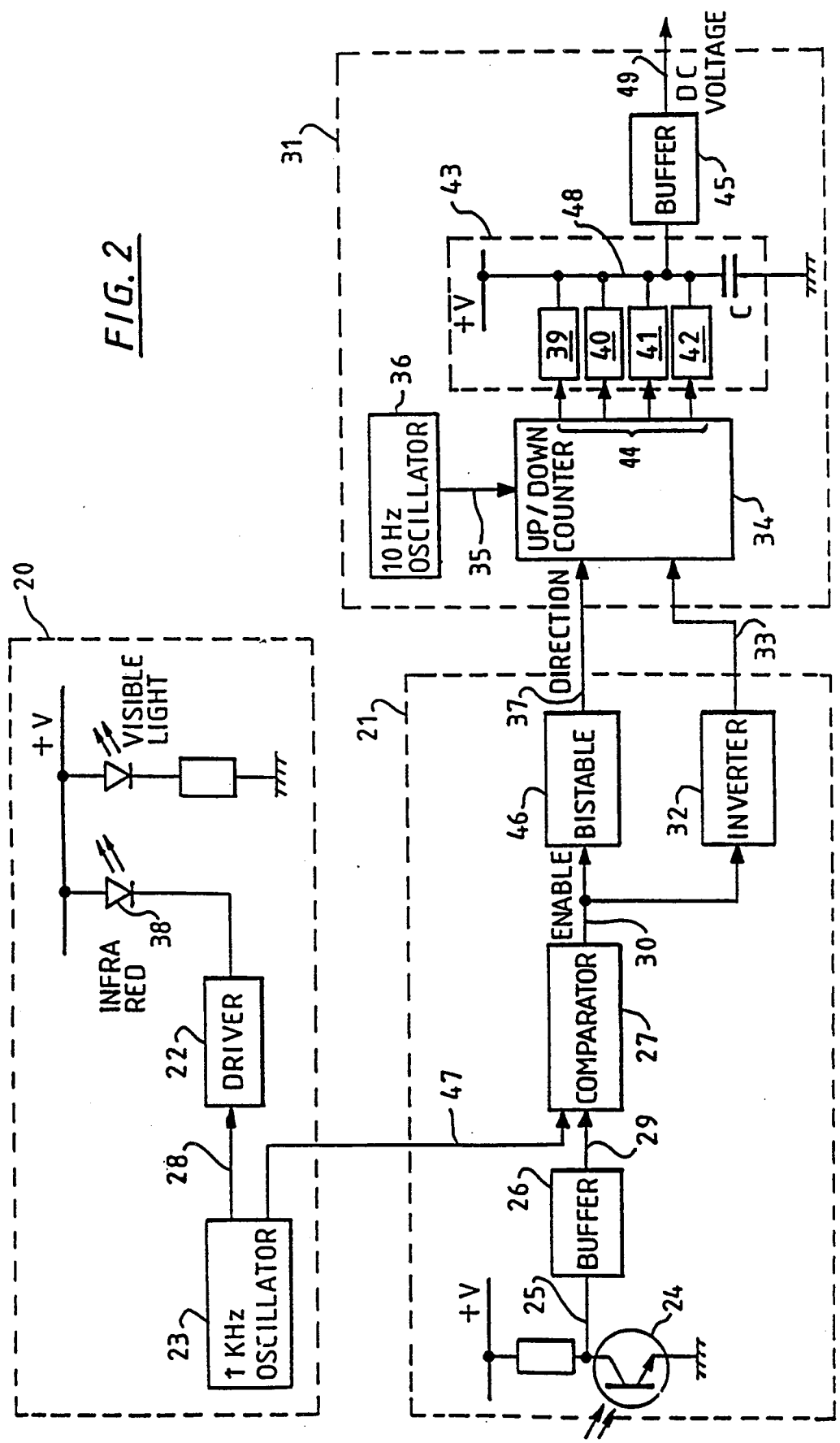
FIG. 2 is a block diagram of solid state control apparatus of the present invention.

FIG. 2 shows a preferred embodiment of control apparatus of the present invention comprising a receiver 21, a convertor 31 and a transmitter 20. The transmitter 20 comprises the infra red LED 38 activated through a driver circuit 22 by an inverted output 28 from a 1 kHz square wave oscillator 23.

The receiver 21 comprises the phototransistor 24 positioned adjacent to the LED 38 and responsive to the light emitted by the LED 38. The phototransistor 24 forms a switch circuit having an output 25 connected via a buffer 26 to a comparator 27. The comparator 27 compares a non-inverted output 47 from the oscillator 23 with the buffer output 29 and asserts an Enable line 30 when a series of pulses is detected on both outputs 47 and 29. The comparator 27 prevents any spurious pulses detected by the phototransistor 24 from affecting the operation of the convertor 31.

The convertor 31 is provided with a bidirectional counter 34 having an enable input 33 connected to the Enable line 30 through an invertor gate 32. The counter 34 further comprises a four bit binary output 44 and a clock input 35, conditionally responsive to a 10 Hz clock signal generated by a 10 Hz square wave oscillator 36. The clock input 35 responds to a 10 hz clock signal generated by a 10 Hz oscillator 36 when the Enable line 30 is set high.

The receiver 21 further comprises a bistable circuit 46 which toggles a Direction line 37 in response to a leading edge transition in the Enable line 30. The counting direction of the counter 34 is determined by the state of the direction line 37. The four bit counter output 44 is connected to four corresponding resistors 39,40,41,42 in a ladder network 43. The ladder network 43 converts the counter output 44 into a DC output voltage level 48 saving one of sixteen possible values. A buffer 45 connects to the output level 48 to an input 49 of a brightness control circuit (not shown) in the display device 10. The brightness control circuit increases the brightness of an image displayed by the display device 10 in response to an increase in the output level 48, and decreases the brightness in response to a decrease in the output level 48.

Figure 3A:
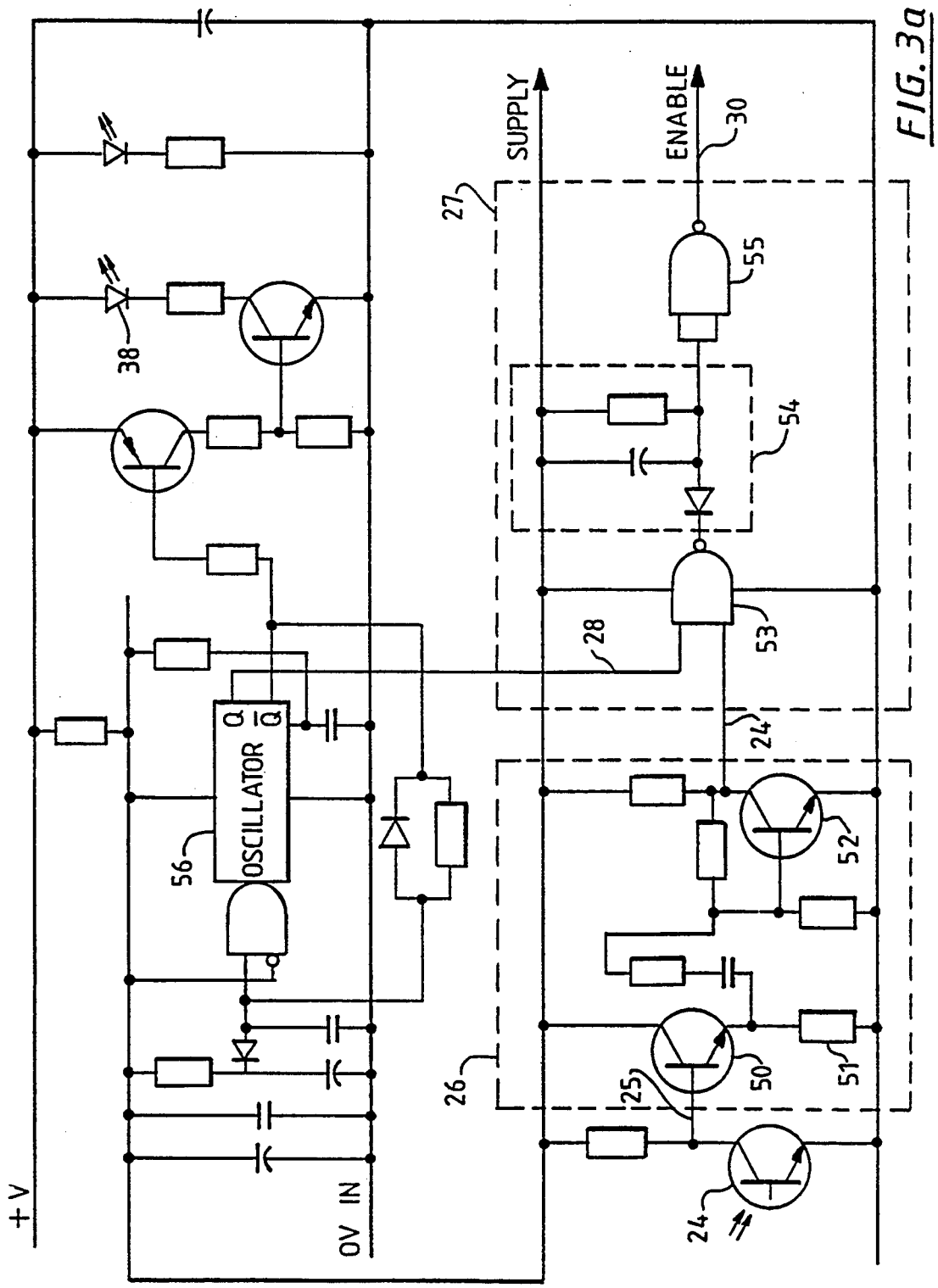

Referring now to FIGS. 3a and 3b, in a preferred embodiment the buffer 26 includes an emitter follower circuit comprising transistor 50 and resistor 51 coupled to an amplifier comprising transistor 52. The comparator 27 comprises NAND gate 53 connected through a low pass filter 54 to invertor gate 55 to provide an AND function. The low pass filter 54 averages any pulses at the output of NAND gate 53 to generate a low level at the input of invertor gate 55. The input of invertor gate 55 is maintained high when there are no pulses at the output of NAND gate 53. A commercially available integrated circuit multivibrator package 56 comprises the oscillator 23. Likewise, the bistable circuit 46 and the bidirectional counter 34 are included in commercially available integrated circuit packages. Low pass filter network 59 suppresses any transient noise spikes at the input to the bistable circuit 46. The invertor gate 32 is discrete component circuit comprising transistor 60. The 10 Hz oscillator 36 comprises NAND gates 61 and 62 coupled by RC feedback network 63. The oscillator 36 is triggered into operation by a pulse generated by the counter 34 on an Overflow line 90 connected to an input of NAND gate 61. Buffer 45 includes transistor 64 in an emitter follower circuit.

Figure 4:
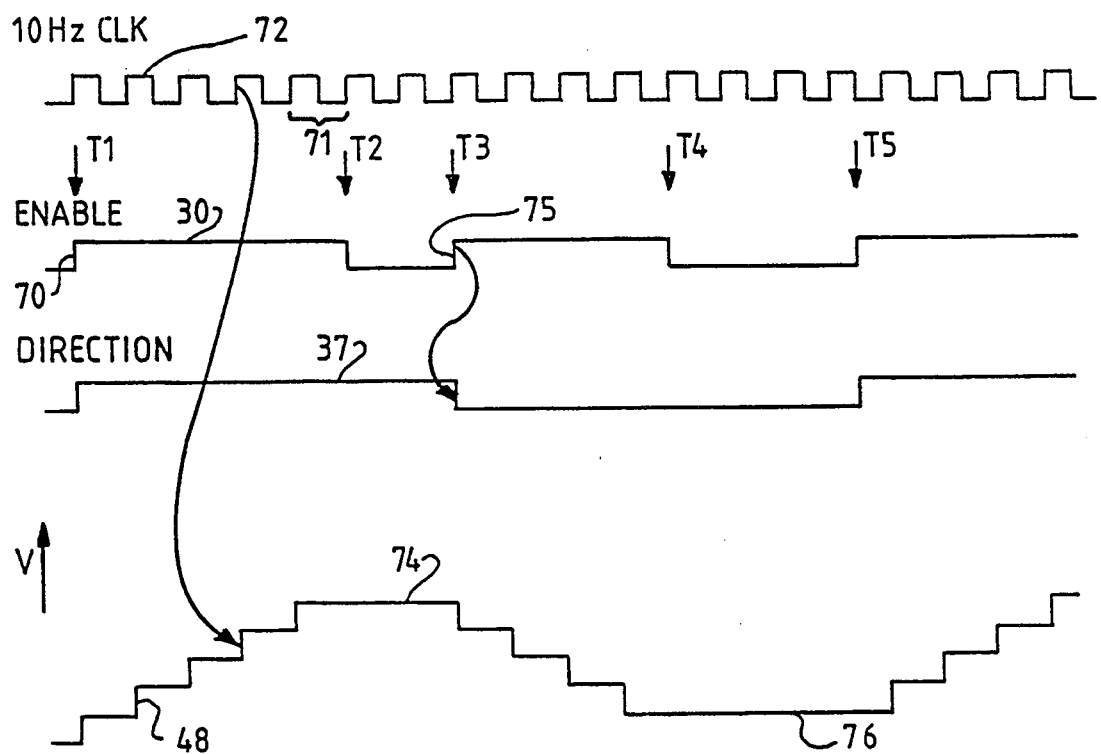
FIG. 4 is a timing diagram corresponding to the control apparatus shown in FIG. 3.

Examples of signals generated in the receiver 21 and the convertor 31 will now be described with reference to FIG. 4. In the example, the Enable line 30 and the Direction line 37 are initially low and the counter 34 is in a reset state. The Direction line 37 therefore sets the counter 34 in a count down mode.

At T1, the reflective article 14 reflects the pulse-modulated beam of light back towards the phototransistor 24. The comparator 27 sets the Enable line 30 high which, in turn, gates the 10 Hz clock signal 72 onto a clock input 35 of the counter 34. A corresponding leading edge transition 70 of the Enable line 30 toggles the Direction line 37. The Direction line 37 now configures the counter 34 to count up. The counter 34 counts up upon each cycle 71 of the clock signal 72 thereby incrementing the counter output 44. The output voltage level 48 increases in corresponding increments, thereby increasing the brightness of the displayed image.

At T2, the reflective article 14 is removed from the path of the beam and the Enable line 30 therefore goes low. The clock input 35 is disabled and the output voltage level 48 is held at a voltage 74 determined by the four bit counter output 44. The counter 34 is maintained in a count up mode by the Direction line 37.

At T3, the reflective article 14 is replaced and the beam is again reflected towards the phototransistor 24. Therefore, the Enable line 30 goes high and the clock input 35 responds to the 10 Hz clock signal. A leading edge transition 75 on the Enable line 30 now toggles to the Direction line 37 and sets the counter 34 to count down. The output voltage level 48 is now reduced in increments on each cycle 71 of the 10 Hz clock signal. The brightness of the displayed image decreases accordingly.

At T4, the reflective article 14 is removed from the path of the beam thus disabling the counter 34. The output voltage level 48 is now held constant 76.

At T5, the reflective article 14 is replaced thereby toggling the Direction line 37 and setting the counter 34 in a count up mode.

The brightness of the display screen can therefore be increased or decreased by a desired amount by reflecting the infra red pulses back through the the light guide for a particular period of time.

Figure 5:
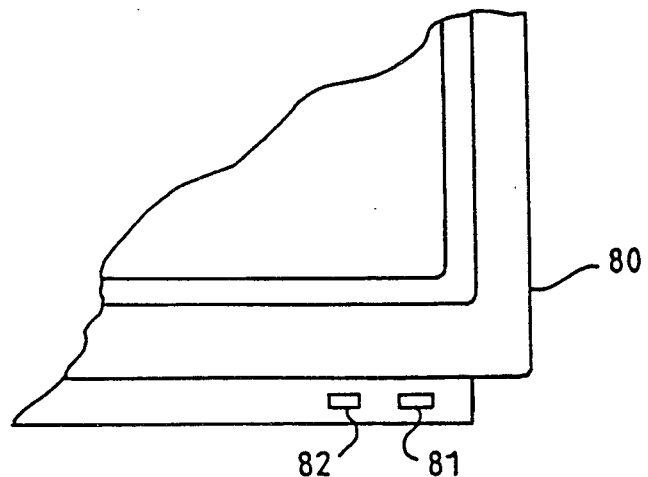
FIG. 5 is a front view of a display device comprising control apparatus of the present invention.

It will be appreciated that control apparatus of the present invention can also be used to permit manual adjustment of the contrast of the display screen. For example, FIG. 5 shows a display device 80 having first and second LEDs, 81 and 82, for providing both brightness and contrast controls in accordance with the present invention.

Figure 6:
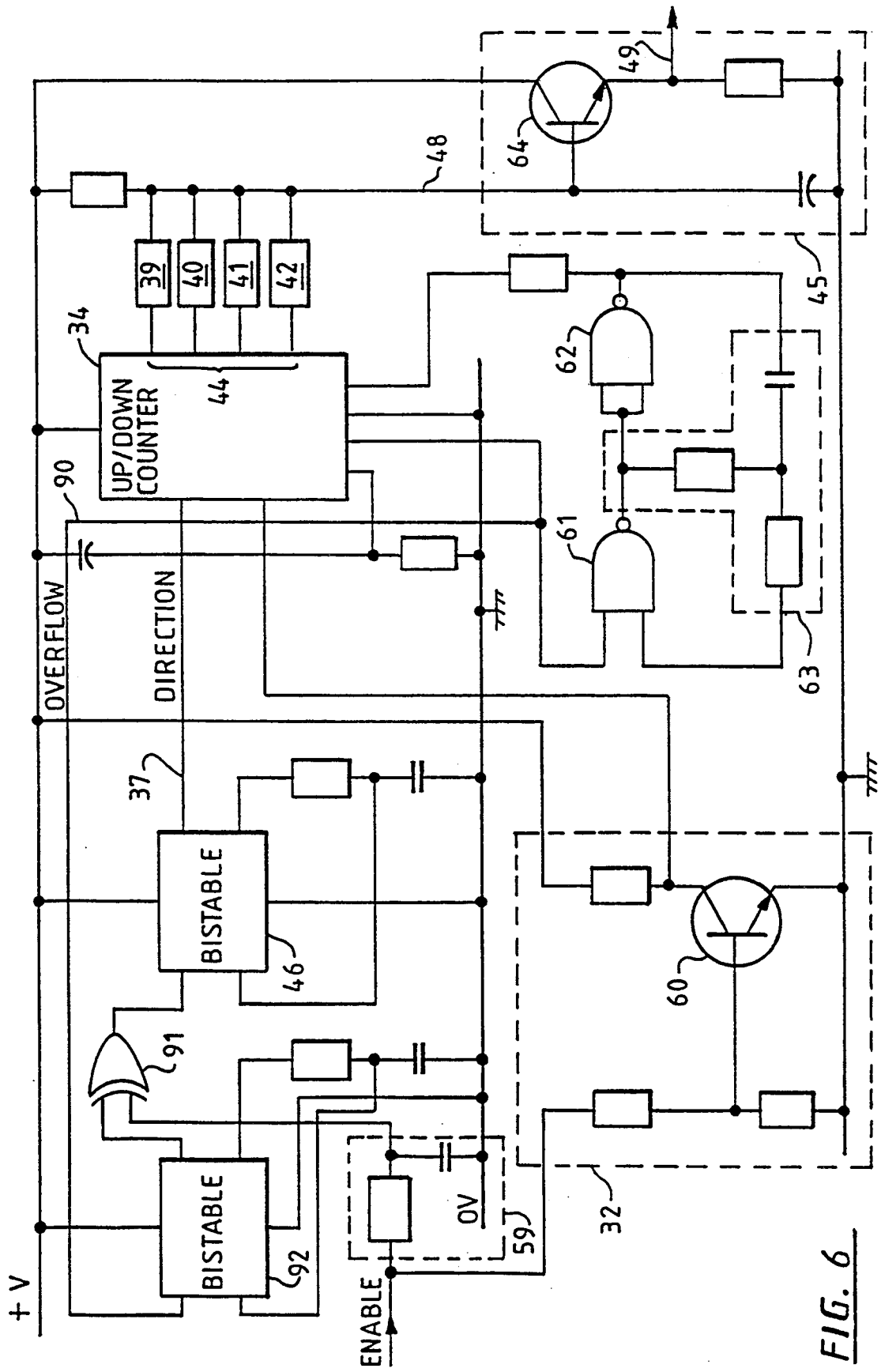
FIG. 6 is a circuit diagram of another example of control apparatus of the present invention.

Another preferred embodiment of the present invention will now be described with reference to FIG. 6. The Overflow line 90 of the counter is normally held low. However, in the count up mode, the Overflow line 90 goes high when the four bits of the counter output 44 are all high and a further clock pulse is applied. In a count down mode, the Overflow line 90 goes high when the four bits of the counter output 44 are all low and a further clock pulse is applied. The Overflow line 90 is connected to the input of a bistable circuit 92. The output of bistable circuit 92 is connected to the input of the bistable circuit 46 through a two input Exclusive OR (EOR) gate 91. The other input of the EOR gate 91 is connected to the Enable line 30. The output of bistable circuit 92 goes high in response to an initial pulse on the overflow line. The next pulse on the overline set the output of bistable circuit 92 high. Further pulses on the overflow line toggle the output of bistable circuit 92 accordingly. In operation, the Direction line 37 can therefore be toggled by either a leading edge transition in either the Enable line 30 or the Overflow line 90.

Figure 7:
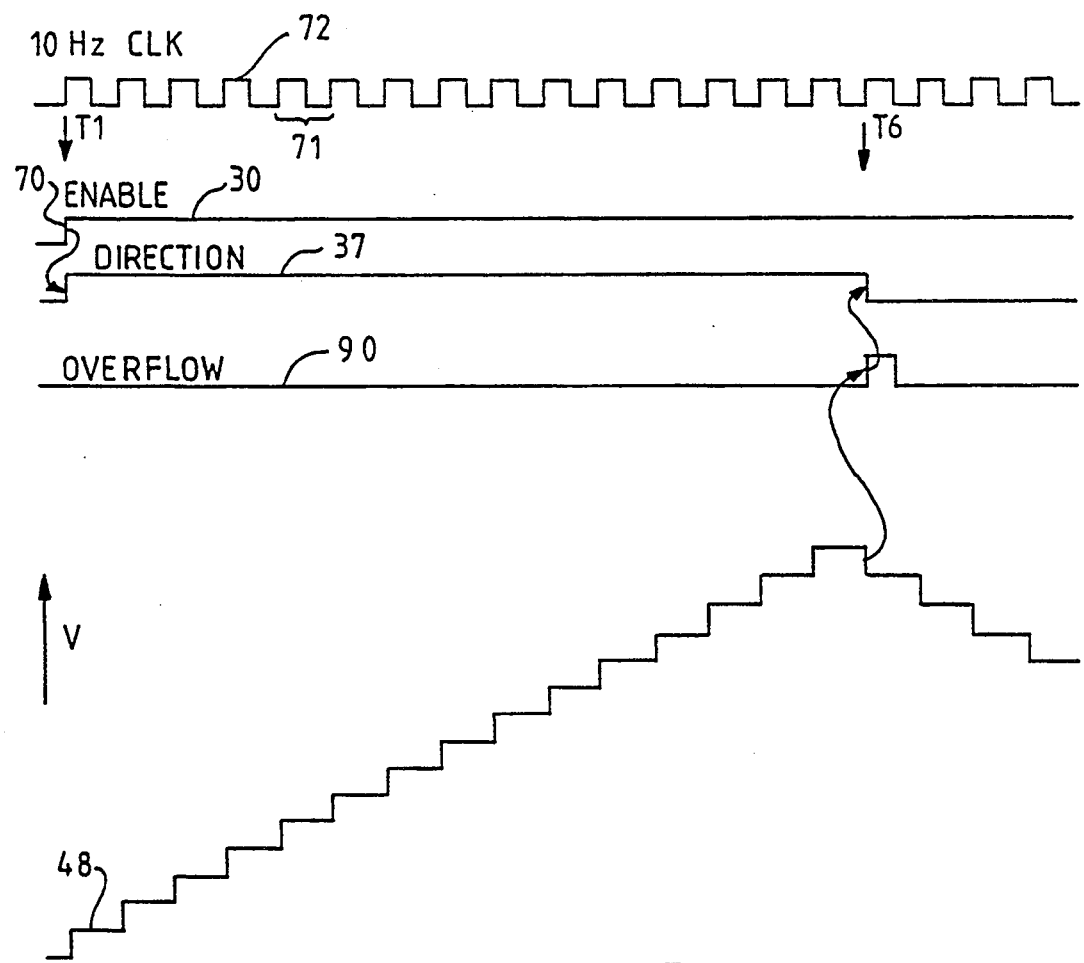
FIG. 7 is a timing diagram corresponding to the control apparatus shogun in FIG. 6.

Examples of signals generated in the preferred embodiment illustrated in FIG. 6 will now be described with reference to FIG. 7. The Enable line 30 and the Direction line 37 are initially low and the counter 34 is in a reset state. The Direction line 37 therefore sets the counter 34 in a count down mode.

At T1, the reflective article t4 reflects the beam of light pulse back towards the phototransistor 24. The comparator 27 sets the Enable line 30 high which, in turn, gates the 10 Hz clock signal 72 onto the clock input 35 of the counter 34. The corresponding leading edge transition 70 on the Enable line 30 toggles the Direction line 37 and thus configures the counter 34 to count up. The counter 34 responds to each cycle 71 of the 10 Hz clock signal 72 by incrementing the four bit binary counter output 44. The output voltage level 48 increases in corresponding increments. The four bits of the counter output 44 are all set high on the fifteenth cycle of the 10 Hz clock signal 72. Accordingly the output voltage level 48 is at a maximum.

At T6, when the next clock pulse occurs, the Overflow line 90 goes high and the Direction line 37 is toggled through the EOR gate 91 to set the counter 34 in the count down mode. The counter 34 now counts down and the voltage level 48 decreases accordingly. The counter 34 continues to count down until the all four bits of the counter output 44 are set low. When the next clock pulse arrives, the Overflow line 90 goes high again and the Direction line 37 is toggled through the EOR gate 91 to set the counter 34 in a count up mode.

Figure 8:
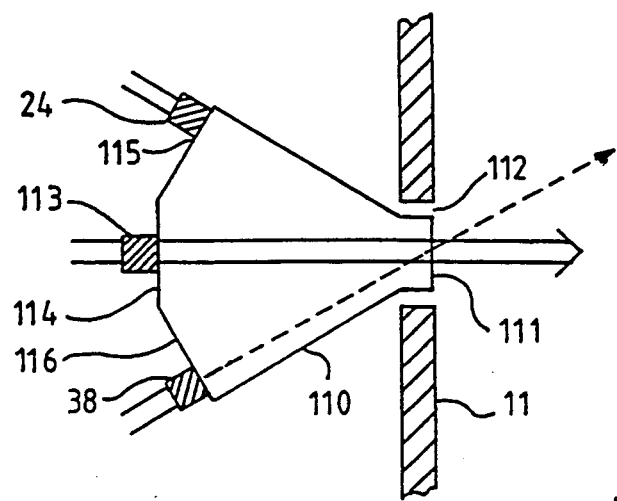
FIG. 8 is a plan view of a light guide for control apparatus of the present invention.

FIG. 8 illustrates a preferred example of a light guide 110 for the control apparatus of the present invention. The light guide 110 is of a substantially triangular cross section having a truncated apex in the form of a flat front face 111. In use, the front face 111 is directed towards the operator through an aperture 112 in the bezel 11. A power on LED 113 is centrally located on an edge 114 of the light guide t10 remote from the front face 111. In operation, the power on LED 113 illuminates the front face 111 when power is applied to the display device 10. The infra red LED 38 is also directed towards the apex from a position at a corner 115 of the light guide 110 remote from the front face 111. Furthermore, the phototransistor 24 is directed towards the front face 111 from a position near another corner 116 of the light guide 110 remote from the front face 111. In operation, most of the infra red light emitted from infra red LED 38 passes out of the light guide 110 through the front face 111. The amount of infra red light internally reflected from the front face 111 towards the phototransistor 24 is negligible. When the reflective article 14 is placed at the front face 111, the infra red light pulses is reflected back through the light guide 110 towards the phototransistor 24 which translates the light pulses into electrical pulses.

Preferred examples of the present invention have been described with reference to a brightness and contrast controls for a visual display. It will be appreciated however that the present invention may find application in a wide range of other electrical devices.

We claim:

1. A control apparatus responsive to manual stimulus comprising:
    a photosensitive detector;
    a transmitter having a light source for projecting a beam of light along a path normally directed away from said detector;
    a receiver for receiving an output from said detector and for generating an enable pulse having a duration determined by a length of time for which the beam is reflected towards the detector by a reflective article;

conversion means for varying an output signal level as a function of the duration of the enable pulse, wherein the conversion means comprises first means for increasing the signal level in response to and during a first enable pulse generated when a reflective article is placed in said beam a first time, and for decreasing the signal level in response to and during a second enable pulse occurring after the first enable pulse, said second enable pulse being generated when a reflective article is placed in said beam a second time; second means for decreasing the signal level during the first enable pulse when the signal level reaches a maximum value, and for increasing the signal level during the second enable pulse when the signal level reaches a mimimum value, and a bidirectional counter having:

a clock input responsive to a first clock signal when the enable pulse is asserted on an enable input; and a direction input responsive to direction control means for configuring the counter to count up in response to the first enable pulse, and for configuring the counter to count down in response to the second enable pulse;

the first means comprises a bistable circuit for switching the direction input between a first logic state and a second logic state in response to the leading edge transition of the enable pulse; and the second means includes means for triggering the bistable circuit to switch the direction input between first and second states in response to either a leading edge transition of the enable pulse or a leading edge transition on an overflow output from the counter.

2. Apparatus as claimed in claim 1 wherein the means for triggering the bistable circuit is an EOR gate.

3. Apparatus as claimed in claim 1 wherein the light source comprises an infra red light emitting diode (LED).

4. Apparatus as claimed in claim 1 wherein the light source, the detector and a visible light emitting power on indicator are directed towards an aperture in an equipment enclosure by a translucent light guide.

5. Apparatus as claimed in claim 1 wherein the detector comprises a phototransistor.

6. A display device comprising control apparatus as claimed in claim 1 for allowing manual adjustment of displayed image brightness.

7. A display device and further comprising control apparatus as claimed in claim 1 for allowing manual adjustment of displayed image contrast.

8. Apparatus as claimed in claim 1 wherein the conversion means comprises a digital to analog converter having inputs connected to outputs of the counter for generating the signal level as a function of the outputs of the counter.

9. Apparatus as claimed in claim 1 wherein the the transmitter comprises an oscillator having an output connected to the light source for pulse-modulating the beam of light with a second clock signal, and wherein the second clock signal has a frequency at least twice as great as the frequency of the first clock signal.

10. Apparatus as claimed in claim 9 wherein the receiver comprises a comparator having inputs connected to a second oscillator output and the detector output for generating the enable pulse wherein the enable pulse duration is determined by a period for which the pulses from the second oscillator are coincident with the pulses from detector output.

* * * * *